United States Patent [19]

Suzuki

[11] Patent Number: 4,885,537
[45] Date of Patent: Dec. 5, 1989

[54] METHOD OF NUCLEAR MAGNETIC RESONANCE IMAGING AND APPARATUS FOR THE SAME

[75] Inventor: Kazuo Suzuki, Katsuta, Japan

[73] Assignee: Hitachi, Ltd., Tokyo, Japan

[21] Appl. No.: 304,477

[22] Filed: Feb. 1, 1989

[30] Foreign Application Priority Data

Feb. 5, 1988 [JP] Japan ................................. 63-25215

[51] Int. Cl.$^4$ ........................................... G01R 33/20
[52] U.S. Cl. .................................... 324/309; 324/306
[58] Field of Search ............... 324/300, 307, 309, 312, 324/322; 128/653

[56] References Cited

U.S. PATENT DOCUMENTS

| | | | |
|---|---|---|---|
| 4,607,221 | 8/1986 | Young | 324/306 |
| 4,689,560 | 8/1987 | Nayler et al. | 324/306 |
| 4,837,512 | 6/1989 | Suzuki | 324/306 |

OTHER PUBLICATIONS

Nishimura, Magnetic Resonance Augiography IEEE Transactions on Medical Imaging, vol. MI-5, No. 3, Sep. 1986, pp. 140-151.

Primary Examiner—Michael J. Tokar
Attorney, Agent, or Firm—Antonelli, Terry & Wands

[57] ABSTRACT

A nuclear magnetic resonance imaging system divides a measurement space, which is a time band in which measurement signals are generated, into a plurality of partial regions, and measures data under the application of the corresponding gradient magnetic fields to the partial regions so that signals for a blood stream part have their phase consistent at the measurement time point for each partial region. The system synthesizes the data in each partial region, thereby producing image data consisting of only the data with a consistent phase over the entire measurement space, and extracts only the image data for the blood stream part by cancelling image data for a quiescent part from the image data synthesized.

16 Claims, 8 Drawing Sheets

METHOD OF NUCLEAR MAGNETIC RESONANCE IMAGING AND APPARATUS FOR THE SAME

BACKGROUND OF THE INVENTION

This invention relates to an apparatus for nuclear magnetic resonance imaging, and particularly to a method and apparatus for imaging moving liquid.

The technique related to this invention is discussed in publication: IEEE TRANSACTIONS ON MEDICAL IMAGAING, Vol. MI-5, No. 3, September 1986, pp. 140–151, and it will be briefed in the following. The operational procedures of imaging blood vessels including a moving part by the nuclear magnetic resonance imaging apparatus will be explained in connection with FIG. 3. In the operation, a pair of pictures called "sensitive picture" and "insensitive picture" are taken, and the latter is subtracted from the former to produce a picture of a blood vessel running system.

Figure 3A:
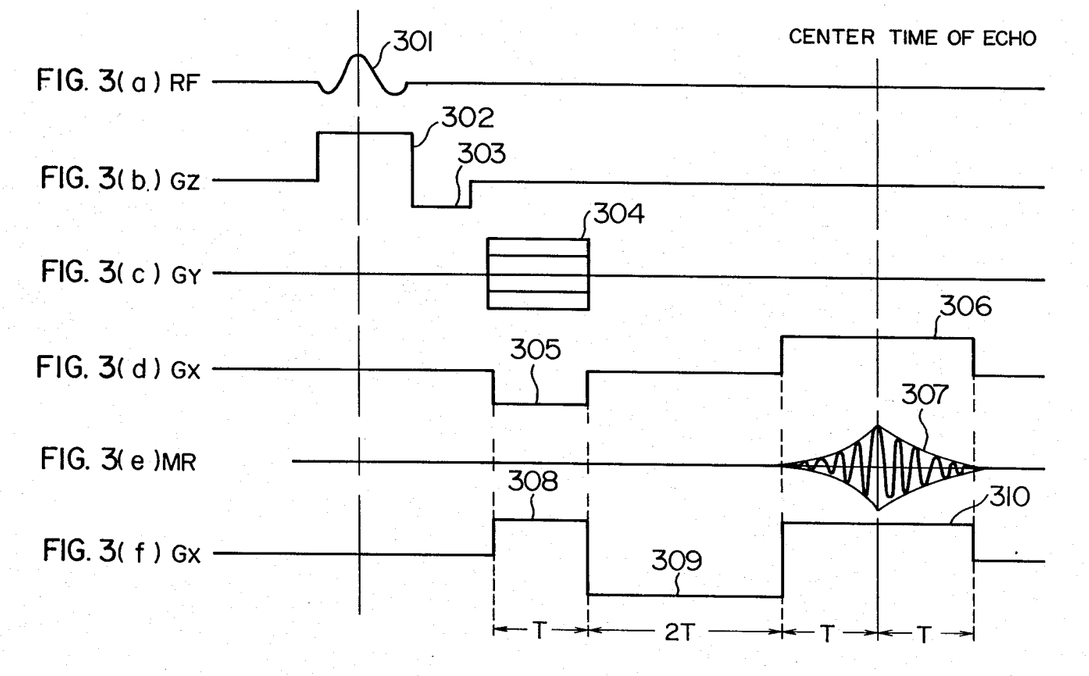

Initially, a sequence (a), (b), (c) and (d) is followed to produce a sensitive picture. On assumption that a blood stream has a dominant direction coincident with the x direction, the imaging procedures are as follows.

(1) A magnetic resonating RF pulse 301 is applied and, at the same time, a z-direction gradient magnetic field 302 is applied so that magnetization on a specific slice plane is excited. Another z-direction gradient magnetic field 303 is applied so as to align the phase of the excited magnetization.

(2) Next, a y-direction gradient magnetic field 304 is applied for implementing phase encoding.

(b 3) At the same time, x-direction gradient magnetic fields 305 and 306 are applied sequentially in the direction coincident with the dominant blood flow direction, and the MR signal 307 is measured during the application of the magnetic field 306.

(4) The measured MR signal 307 is rendered the Fourier transformation process, and a picture is reproduced.

The x, y and z directions are the axes of a 3-dimensional orthogonal coordinate system established in the space where a body under test is placed.

Next, a sequence (a), (b), (c) and (f) of FIG. 3 is followed to produce an insensitive picture. The above items (1) and (2) are equally applied.

Next, as item (b 3), a series of x-direction gradient magnetic fields 308, 309 and 310 are applied, and the MR signal 307 is measured during the application of the magnetic field 301. The measured MR signal 307 is operated by the Fourier transformation process, and a picture is reproduced.

The following explains the principle of producing a picture of the blood vessel running system by subtracting the sensitive picture from the insensitive picture obtained as described above.

In FIG. 3, phase rotations of magnetization in the body under test caused by the applications of the x-direction gradient magnetic field 305 and magnetic field 306 in its former half period T are called "first phase" and "second phase", respectively. In a quiescent part, the sum of the first phase and second phase is zero, and the phases are consistent at the center time of echo. This is a signal for the quiescent part. In a blood stream part, magnetization moves at a velocity within the gradient magnetic field, and in this case the sum of the first phase and second phase does not become zero, but results in a variable value depending on the blood flow velocity v. Assuming that the v is constant at all times and it is in the x direction, the sum $\phi$ of the first phase and second phase is formulated as follows.

$$\phi = 2\pi \int_0^{4T} \gamma \cdot G(vt)dt = 2\pi\gamma \left( -\int_0^T G \cdot vt\, dt + \int_{3T}^{4T} G \cdot vt\, dt \right)$$

$$= 6\pi\gamma G v T^2$$

where $\gamma$ is a constant, G is the gradient of the x-direction magnetic field, and T is the application time length of the x-direction gradient magnetic field.

Generally, the blood flow velocity v is variable along the radial direction of blood vessel, i.e., slicing direction, and therefore the phase $\phi$, which is dependent on the blood flow velocity v, also varies along the slicing direction. Consequently, measured signals cancel out each other, resulting in a small amplitude of signals. From this viewpoint, the blood vessel running system is not imaged on the basis of only a sensitive picture.

In the insensitive sequence, the phase rotation of magnetization caused by the application of the serial x-direction gradient magnetic field 308 and magnetic field 309 in its former half period T is called "third phase", and the phase rotation of magnetization caused by the application of the x-direction gradient magnetic field 309 in its latter half period T and magnetic field 310 in its former half period T is called "fourth phase". The sum of the third and fourth phases in a quiescent part is zero, as in the case of the sensitive sequence mentioned above. In a part of blood stream, if the blood flow velocity v is constant at all times and is in the x direction, the sum $\phi'$ of the third and fourth phases is also zero. The reason is that the third phase $\phi_3$ and fourth phase $\phi_4$ are expressed as follows through the same mathematical treatment as for the above case of $\phi$:

$\phi_3 = -2\pi\gamma T^2 G v$ $\phi_4 = 2\pi\gamma T^2 G v$

And, $\phi' = \phi_3 + \phi_4 = 0$

Accordingly, the variability of phase $\phi'$ due to flow velocities does not occur, and the signal for a blood stream part is produced when phases are consistent again at the center time of echo. Consequently, blood vessels appear in the insensitive picture. By subtracting the sensitive picture from the insensitive picture, the quiescent part is cancelled out and only the blood vessel running system is imaged.

Another related technique includes the one in which the angle of magnetization (of a quiescent part) fallen by the magnetic resonating RF pulse is made 360°. Although magnetization of quiescent part is not excited, magnetization of a blood stream part is not fallen completely by 360° due to the flow, and therefore it has a lateral magnetization. After that, by measuring the signal through the induction of echo by following the sequence shown by (a), (b), (c) and (f) in FIG. 3, only the signal for the blood stream part can be produced. The sequence is identical to the case of producing a sensitive picture, except that the magnetic resonating RF pulse 301 of (a) in FIG. 3 is replaced with a 360°-falling RF pulse. As a result, the blood vessel running system is imaged from a single insensitive picture.

However, the foregoing related techniques of blood vessel imaging do not comprehend the nullification of phase difference, at the center time of echo at which the measured signal exhibits a maximum value, between the resonance signal for a part having a flow velocity and an expected resonance signal for the same part with the assumption of quiescence (this phase difference will be termed "flow velocity phase"). Therefore, due to various blood flow velocities in reality, there is a great disparty in flow velocity phases as the time point is moved forward and backward from the center time of echo, and therefore even an insensitive picture cannot extract blood vessels clearly.

SUMMARY OF THE INVENTION

For the achievement of high-fedelity imaging, it is necessary to have signals before and after the center time of echo. The reason is that if signals are measured, as time passes on, always in a state of consistent phase, the rotational speed of phase of each spin, i.e., frequency, is made known. Once the frequency is known, it becomes possible to determine accurately the positions of spins having various frequencies through fast Fourier Transformation (FFT).

The present invention is based on this situation, and its prime object is to provide a method and apparatus for nuclear magnetic resonance imaging, in which the flow velocity phase is prevented from fluctuating in the measured data thereby to produce a satisfactory picture of a blood vessel running system.

In order to achieve the above objective, the invention recognizes the phase difference between a resonance signal produced for a part of body having a flow velocity and a resonance signal which would be produced for the same part when the body is assumed to be quiescent, and sets a predetermined value for the phase difference (this value is called "target phase value").

The invention includes means which divides a time band in which signals are generated, i.e., measurement space, into a plurality of partial regions, and takes pictures sequentially for the partial regions so that the flow velocity phase of signal in each specific partial region is consistent with the target phase value, and synthesizes image data of the whole measurement space from all image data of pictures, and extracts the signal of the part having a flow velocity from the synthesized data.

Namely, the above-mentioned means performs the following.

1. It divides a measurement space X into a plurality of partial regions $X_1, X_2, \ldots, X_n$, and establishes a target phase value $\phi_j$ of flow velocity phase in each area $X_j$.

2. It takes pictures corresponding to the partial regions $X_j$ as follows.

(i) A magnetic resonating RF pulse is applied so that the magnetization of part of a body under test is excited. The time point of pulse application is recognized to be time 0.

(ii) A gradient magnetic field $G_j$ which meets the following equation is applied and resonance signals $S_j$ are measured in the whole measurement space.

$$\int_0^{t_j} G_j(t) \cdot t \, dt - t_j \int_{T_0}^{t_j} G_j(t) dt = \frac{\theta_j}{\gamma'} \quad (1)$$

where $t_j$ is a representative value selected from the time points of measuring signals in partial areas $X_j$ (this value is called "fetching time point"), $T_o$ is the center time of echo, and $\gamma'$ is a constant. Values of $\phi_j$ and $t_j$ are set to solve the equation (1) for $G_j$, and the $G_j$ to be applied is evaluated.

(iii) For the imaging based on the Fourier transformation method using phase encoding, the above items (i) and (ii) are repeated as many times as the number of the times of phase encoding.

3. The measured data $S_j$ are weighted so that values of $S_j$ in the partial regions $X_j$ are extracted, and synthesized data S of a piece of picture consisting solely of the data which are obtained, when the flow velocity phase is consistent with the target phase value.

4. The synthesized data S is operated by a computation process such that signals from the quiescent part are cancelled, and only a signal from the blood stream part is extracted.

The theoretical base of the inventive imaging technique will be explained mathematically in the following. It is assumed that the blood flow velocity in a body under test is constant at all times. It will be appreciated from the following explanation that the flow velocity phase is proportional to the left side of the equation (1). Namely, assuming that, at an arbitrary point Q, protones in blood, i.e., atoms of hydrogen represented by $\{p^k\}$ (k=1, 2, ..., n) which flow into close to the point Q at time $t=t_j$ have individual velocities $v^k$. And positions $Q^k$ of $P^k$ at each time point are given as follows.

$$Q^k(t) = (Q - t_j v^k) + t \cdot v^k \quad (2)$$

There is the following fundamental expression for the phase rotation speed:

Phase rotation speed = $\gamma \cdot$(strength of magnetic field)

The strength of magnetic field at a position $Q^k$ is expressed as follows.

$$G_j(t) \cdot Q^k(t)$$

Accordingly, the degree of rotation of phase of protons $p^k$ at time $t_j$ is indicated by $\phi_j^k$ as follows.

$$\phi_j^k = \int_0^{t_j} \gamma \cdot G_j(t) \cdot Q^k(t) dt$$

At time $t_j$ a quiescent part around the point Q has the phase $\phi_j$ given by the following equation.

$$\phi_j = \int_0^{t_j} \gamma \cdot G_j(t) Q \, dt$$

Accordingly, the flow velocity phase $\phi$ around the point Q at time $t_j$ is given by the following equation.

$$\phi = \phi_j^k - \phi_j \quad (3)$$

$$= \int_0^{t_j} \gamma \cdot G_j(t)Q^k(t)dt - \int_0^{t_j} \gamma \cdot G_j(t)Qdt$$

Substituting equation (2) into (3) gives:

$$\phi = \gamma V^k \left( \int_0^{t_j} G_j(t)t\,dt - t_j \int_{T_0}^{t_j} G_j(t)dt \right) \quad (4)$$

It in now appreciated from the above equation that the flow velocity phase $\phi$ is proportional to the left side of the equation (1).

In the case where $\{V^k\}$ is virtually constant irrespective of k, with the right side of equation (1) being $\gamma'$ obtained by the multiplication between the mean value $\overline{V^k}$ and $\gamma$, the right side of the equation (b 4) results as follows.

$$\gamma \cdot V^k \left( \frac{\theta_j}{\gamma'} \right) = \gamma V^k \cdot \frac{\theta_j}{\gamma V^k} = \theta_j$$

And, it is appreciated that the actual flow velocity phase $\phi$ is equal to $\theta_j$.

With a prior assumption of $\theta_j=0$ being assumed in the above explanation, when the solution $G_j$ of equation (1) with $\theta_j=0$ is applied, the result of equation (4) indicates that the actual flow velocity phase $\phi$ is zero.

Based on the foregoing, by application of a gradient magnetic field so that the equation (1) is met, the flow velocity phase can be made consistent with the target phase value at time $t_j$. Accordingly, by extracting values of measured resonance signals $S_j$ for each value of j at time $t_j$ and implementing synthesis, synthesized data, with flow velocity phases being virtually consistent with respective target phase values at all times in the measurement space, can be obtained. Particularly, with a setting being $\theta_j=0$, the right side of the equation (1) becomes zero, and the application timing of $G_j$ is determined independently of $\{V^k\}$, and moreover, in this case, the assumption that $\{V^k\}$ is constant irrespective of each proton k is no more required.

In case of $\theta_j = C \cdot \overline{V^k}$, where C is a constant being independent of the value of $\overline{V^k}$, $\overline{V^k}$ is the mean value of $\{V^k\}$, the equation (4) gives: $\gamma' = \overline{V^k} \cdot \gamma$, and therefore the right side of the equation (1) is reduced to as follows.

$$\theta_j/\gamma' = \frac{\theta_j}{V^k \cdot \gamma} = \frac{C \cdot V^k}{V^k \cdot \gamma} = \frac{C}{\gamma}$$

According, the application timing of $G_j$ is determined independently of $\{V^k\}\gamma$.

Furthermore, by calculating $\theta_j$ from the phase of the picture reproduced from the synthesized data, the mean value of $\{V^k\}$ for $\theta_j/C$ can be evaluated.

The nuclear magnetic resonance imaging apparatus according to this invention enables the measurement of phase variations (flow velocity phases) of signals created by flow velocities over the entire measurement space of MR signals so that they are virtually consistent with predetermined values. Consequently, a high quality picture of a blood vessel running system, with little deterioration of picture quality due to flow velocities, can be obtained.

BRIEF DESCRIPTION OF THE DRAWINGS

FIGS. 3a, 3b, 3c, 3d, 3e, and 3f show a sequence chart used in the related technique;

DESCRIPTION OF THE PREFERRED EMBODIMENTS (Embodiment 1)

Figure 4:
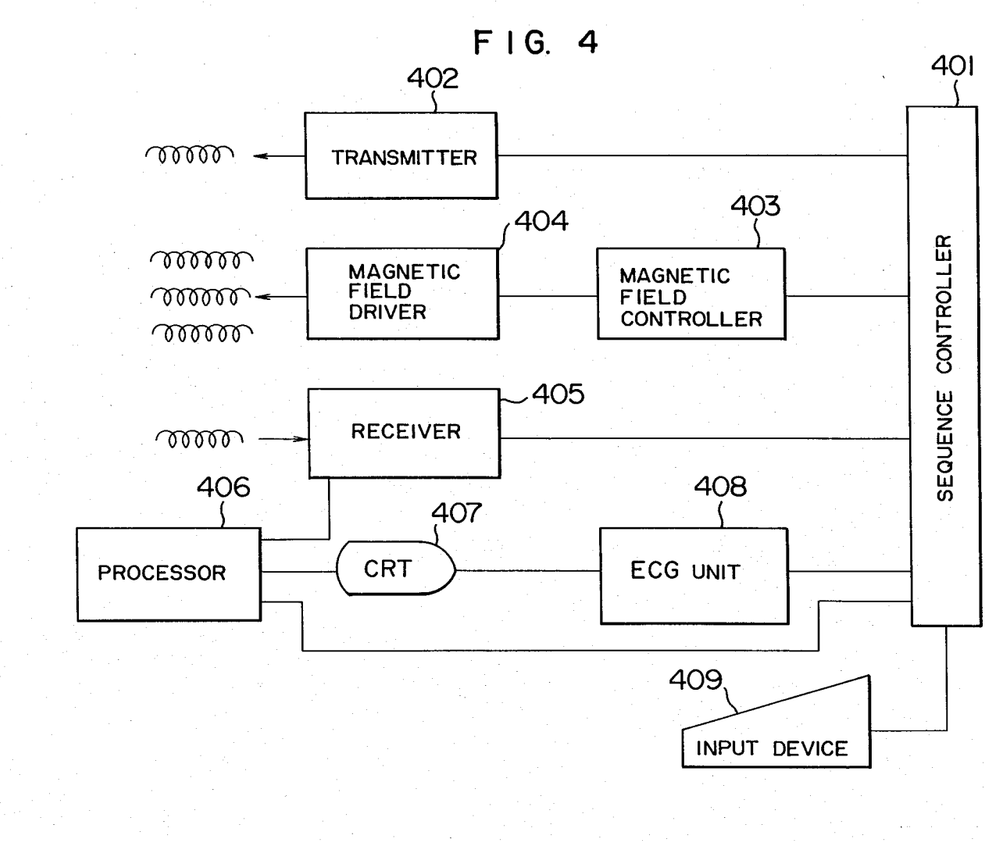
FIG. 4 is a block diagram showing an embodiment of the nuclear magnetic resonance imaging apparatus according to this invention.
Figure 5A:
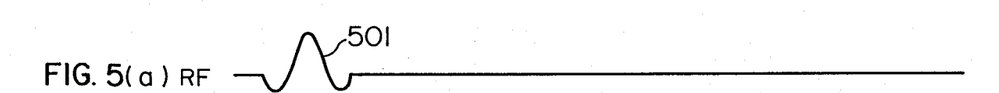
FIGS. 5a, 5b, 5c, 5d, 5e, and 5f along with FIGS. 7a, 7b, 7c, 7d and 7e are diagrams showing the sequence for RF and gradient fields used in the embodiment of this invention.
Figure 5B:
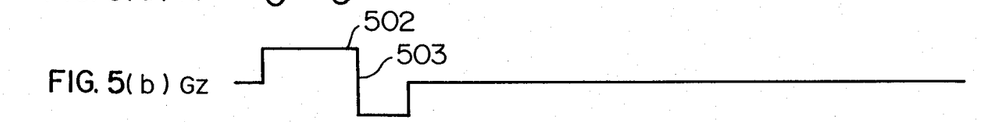
Figures 5C, 5D:
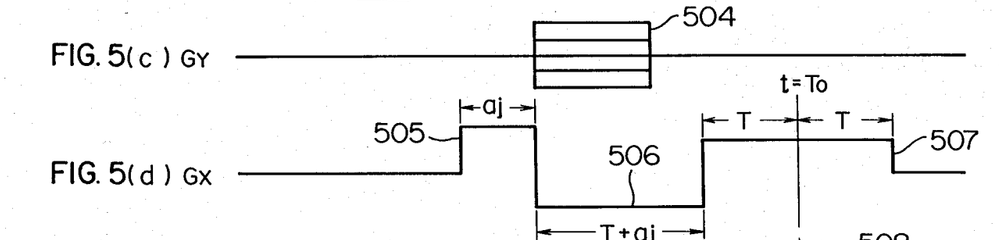
Figure 5E:
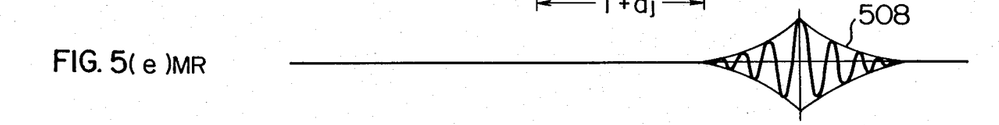
Figure 5F:
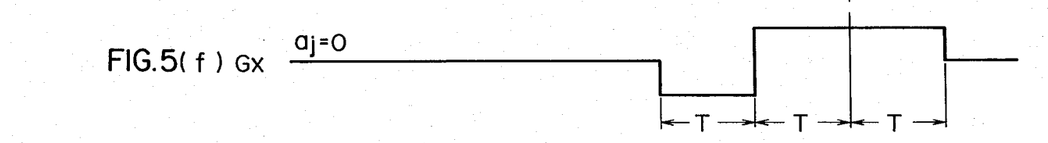

FIG. 4 is a systematic block diagram showing an embodiment of the nuclear magnetic resonance imaging apparatus according to this invention. In the figure, a sequence controller 401 is designed to control the generation of various pulses for detecting MR signals from a body under test and control the strength of magnetic field. The sequence controller 401 operates on a transmitter 402 to generate a high-frequency pulse for causing the resonation of a specific nuclide in the body under test.

The sequence controller 401 incorporates a computation unit including a CPU, memory and input/output interface, and upon receiving phase value $\theta_j$ and fetching time $t_j$ shown in the equation (1) through an input device 409 such as a keyboard, it solves the equation (1) using the internal computation processor to determine the gradient magnetic field $G_j$ suitable for the selected imaging condition, and issues a relevant command to a magnetic field controller 403. It executes the control of gradient magnetic field in steps 101, 102 and 105 in FIG. 1A and steps 101 and 102 in FIG. 1B.

The magnetic field controller 403 is designed to issue a signal for controlling arbitrarily the static magnetic field which determines the resonance frequency of NMR signal and the strength and direction of the static magnetic field on the basis of the command from the sequence controller 401. This signal is entered to a magnetic field driver 404, which generates a magnetic field necessary for the measurement on the basis of the signal from the magnetic field controller 403.

A receiver 405 receives the NMR signal generated by the body under test, and, on the basis of the measured signal taken from the receiver 405, the processing unit 406 performs picture formation and various computations, so that the reformed picture is displayed on a CRT display unit 407.

The processing unit 405 incorporates a computation unit including a CPU, memory and input/output interface, and it functions as follows. The unit 405 stores data at each time of measurement. This operation corresponds to steps 102 and 105 in FIG. 1A and step 102 in FIG. 1B. The unit 405 implements the weighting process for the measured data. This operation corresponds to step 103 in FIG. 1A and step 111 in FIG. 1B. The unit 405 synthesizes necessary imaging data. This operation corresponds to step 104 in FIG. 1A and step 112 in FIG. 1B. The unit 405 extracts only data for a blood stream part. This operation corresponds to step 106 in FIG. 1A and step 113 in FIG. 1B.

An ECG (electrocardiogram) 408 detects the heart beat of the body under test so that imaging is timed to the heart beat.

Figure 1A:
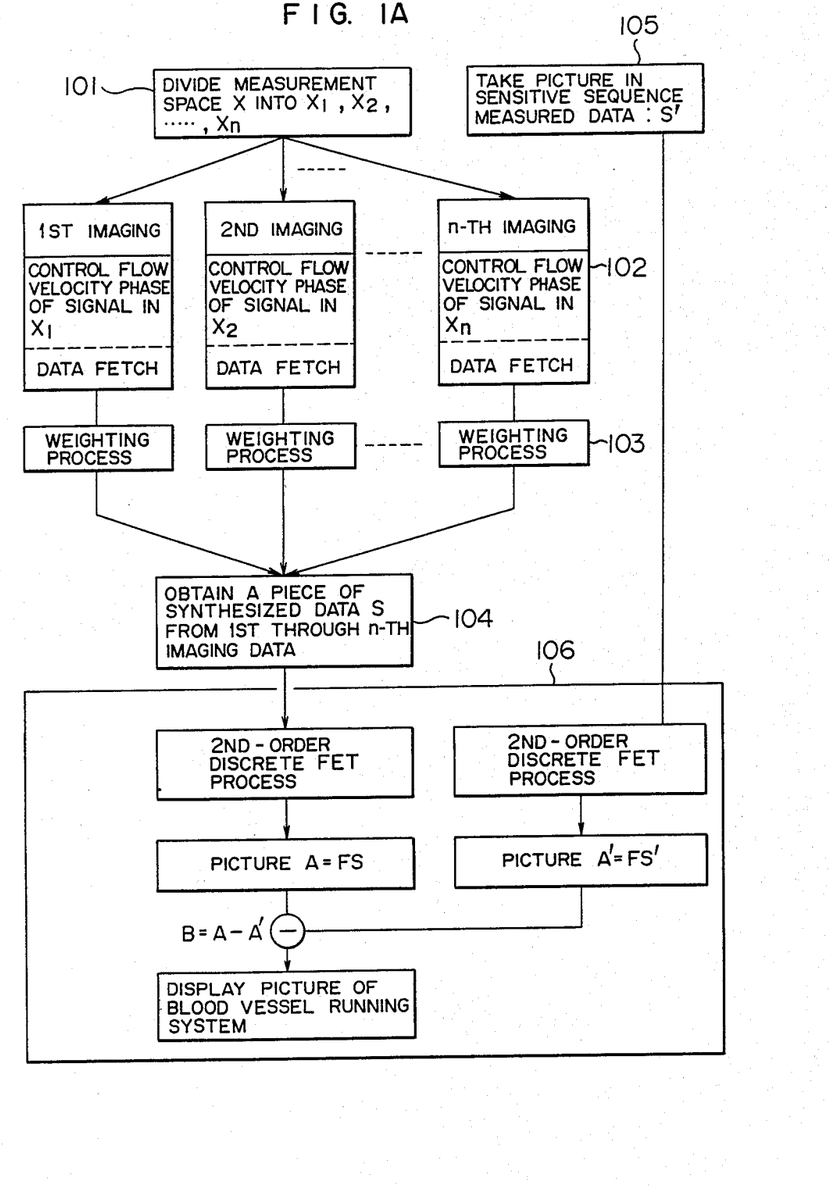
FIGS. 1A and 1B are flowcharts of an embodiment of this invention.

The control procedures of this embodiment based on the foregoing arrangement will be described in connection with FIG. 1A.

Figure 2:
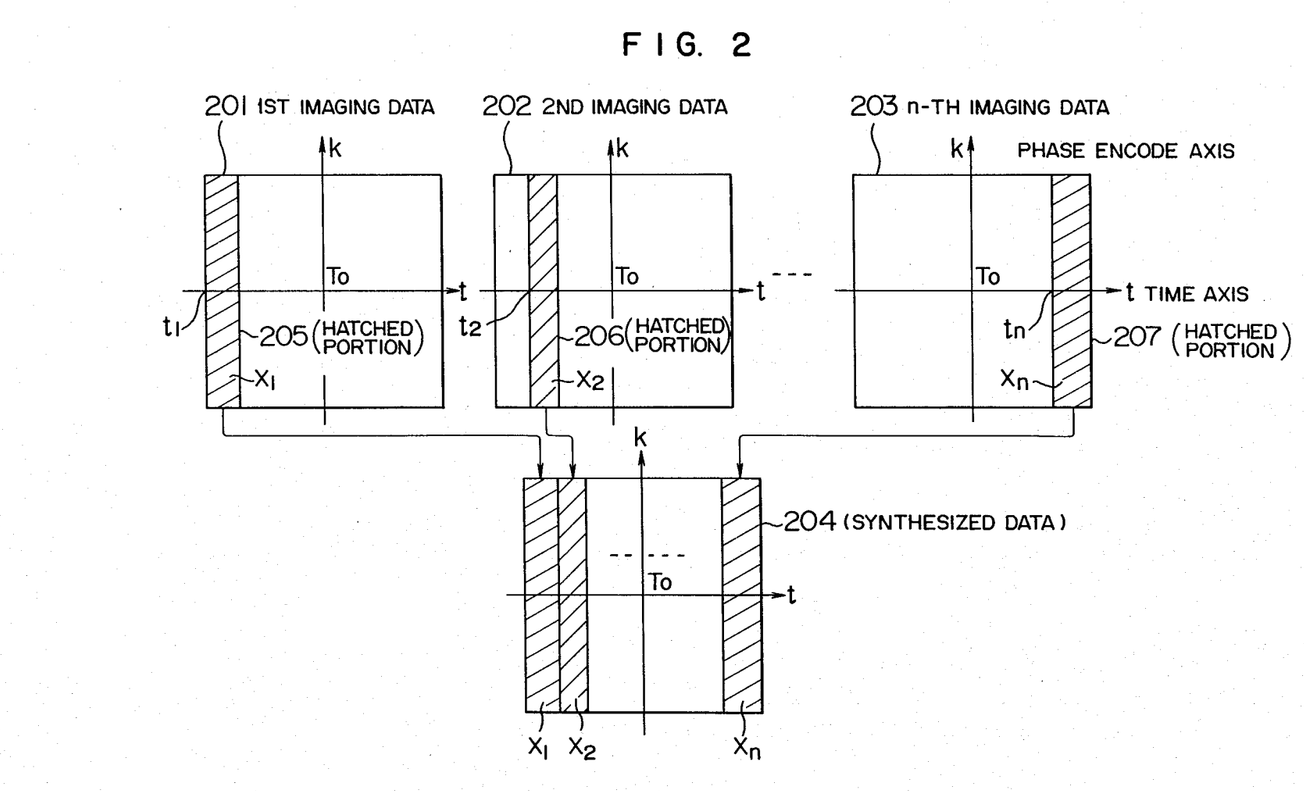
FIGS. 2 and 6 are diagrams showing the order of producing the measurement space, partial regions and synthesized data.

(1) Step 101 divides a measurement space X into $X_1$, $X_2$, $X_3$, $X_j$. Specifically, the space is divided as shown by 205, 206 and 207 in FIG. 2 to establish partial regions of the measurement space X. Indicated by 201, 202 and 203 are total imaging data, and weights are applied to the total imaging data so that data in the partial regions 205, 206 and 207 are taken out. Namely, with the center time of echo being $T_0$, for a point $t_j$ which equally divides by n a section t indicative of the range of total measurement space:

$$T_0 - T \leq t \leq T_0 + T$$

$X_j$ is determined as follows.

$$X_j = \{(t, k) \epsilon X | t_j \leq t \leq t_{j+1}\}$$

where $j = 1, 2, \ldots, n$ and $t_1 = T_0 - T$, $t_{n+1} = T_0 + T$. In this embodiment, $T_0 = 22$ ms, $T = 4$ ms, and $\theta_j = 0$.

(2) Step 102 applies gradient magnetic fields $G_j$ for $X_j$ to control the flow velocity phase of signals in $X_j$. This sequence is shown by (a), (b), (c) and (d) in FIG. 5. In the figure, $a_j$ is altered by $j = 1, j = 2, \ldots, j = n$, and imaging is carried out once for each $a_j$.

In this case, $a_j$ and $c_j$ are as follows.

$$a_j = \sqrt{T^2 - \frac{1}{2} c_j^2}$$

$$c_j = t_j - T_0$$

At this time, the equation (1) is met by the following reason. In this embodiment, the equation (1) can be written as follows.

$$\begin{aligned}
\text{Left side of equation (1)} &= \int_{T_0-2T-2a_j}^{T_0-2T-a_j} G \cdot t \, dt - \int_{T_0-2T-a_j}^{T_0-T} G \cdot t \, dt + \int_{T_0-T}^{t_j} G \cdot t \, dt - t_j \int_{T_0}^{t_j} G \, dt \\
&= \frac{G}{2} \{ 2(T_0 - 2T - a_j)^2 - (T_0 - 2T - 2a_j)^2 - (T_0 - T)^2 + t_j^2 - \\
&\quad (T_0 - T)^2 \} - t_j \cdot G(t_j - T_0) \\
&= \frac{G}{2} \{ 2T^2 - (T_0 - t_j)^2 - 2a_j^2 \}
\end{aligned}$$

Right side of equation (1) $= \theta_j / \gamma$

Since $\theta_j$ is determined to be zero, the equation is solved for $a_j$, with the left side of the equation (1) being zero, as follows.

$$a_j = \sqrt{T^2 - \frac{1}{2}(T_0 - t_j)^2}$$

On the horizontal axis of measurement time $t_j$, the $a_j$ draws a parabolic curve having a peak of T at the center time $t_j = T_0$ of the measurement space.

Accordingly, time points with the same time length front and back from $t = T_0$ have the same value of $a_j$.

This fact implies that the measured signal has a consistent phase at symmetrical time points with respect to $t = T_0$. By increasing the value of j from 1 so that the value of $a_j$ increases, the time point of consistent phase of measurement signal moves from $T_0 - T$ toward $T_0$.

The procedure of imaging at each time is as follows. The value of k is incremented by 1 from $-127$ to 128 so that the following items (i)–(iv) are repeated 256 times, and measured signals $S_j(t,k)$ are produced. During the operation, the body under test is assumed to be placed in a static magnetic field of 5000 G.

(i) The ECG unit 408 produces a specific wait time from the R-wave of heart beat.

(ii) A magnetic resonating RF pulse 501 for falling the magnetization by 90° and a z-direction gradient magnetic field Gz (0.3 G/cm) 502 are applied for a duration of 4 ms so that magnetization of a specific slice plane is excited, and a further z-direction gradient magnetic field $-Gz$ 503 is applied for a duration of 2 ms so that the magnetization has a consistent phase.

(iii) A y-direction gradient magnetic field Gy·k/128 (Gy=0.3 G/cm) 504 is applied for a duration of 4 ms.

(iv) At the same time, an x-direction gradient magnetic field Gx (Gx=0.3 G/cm) 505 is applied for a duration of $a_j$ ms, and next an x-direction gradient magnetic field $-Gx$ 506 is applied for a duration of $T + a_j$ ms, and next an x-direction gradient magnetic field Gx 507 is applied for a duration of 2T ms and the MR signal 508 generated on the specific slice plane excited by item (ii) is measured.

(b 3) Step 103 implements such a weighting process that only data of partial regions $X_1, X_2, \ldots, X_n$ are taken out from the first to n-th total imaging data $S_j(t,k)$. The weighting factors are given as a function of time.

(4) Step 104 uses the weighted measurement data $S_j(t,k)$ provided by the step 103 to produce synthesized data S(t,k):

$$S(t,k) = S_j(t,k) \text{ if } t_j \leq t \leq t_{j+1} \ (j=1, 2, \ldots, n)$$

(5) Step 105 takes a picture in the aforementioned usual sensitive sequence to obtain measured data S'(t, k). In FIG. 5, the gradient magnetic field Gx shown by (f) for $a_j = 0$ in FIG. 5 is used for the measurement.

The procedure implements the items (i)–(iv) of the step 102 by incrementing k by 1 from $-127$ to 128 in exactly the same manner as the conventional sensitive sequence, but without dividing the measurement space. The body under test is placed in a static magnetic field of 5000 G.

(6) Step 106 implements the second-order discrete FFT process for two data S(t,k) and S'(t,k) to produce pictures A and A':

A = FS (where F signifies the FFT process)

A' = FS'

Finally, the two pieces of pictures are differentiated to extract a picture B of the blood vessel part:

$$B = A - A'$$

Based on the extracted signal B of blood vessel part, the picture of the blood vessel running system is displayed.

In this manner, the synthesized data S(t,k) provides only signals at consistent flow velocity phases in the total measurement space X, and therefore the picture A has the image of blood stream part, while the picture A' does not, as explained previously for the sensitive picture based on the related technique. The picture B which is the difference of the two pictures has the image of blood stream and does not have the image of quiescent part because of cancellation. Accordingly, a satisfactory picture of blood vessel running system can be produced.

Next, another embodiment of this invention will be described in comparison with the preceding embodiment.

(Embodiment 2)

Figure 1B:
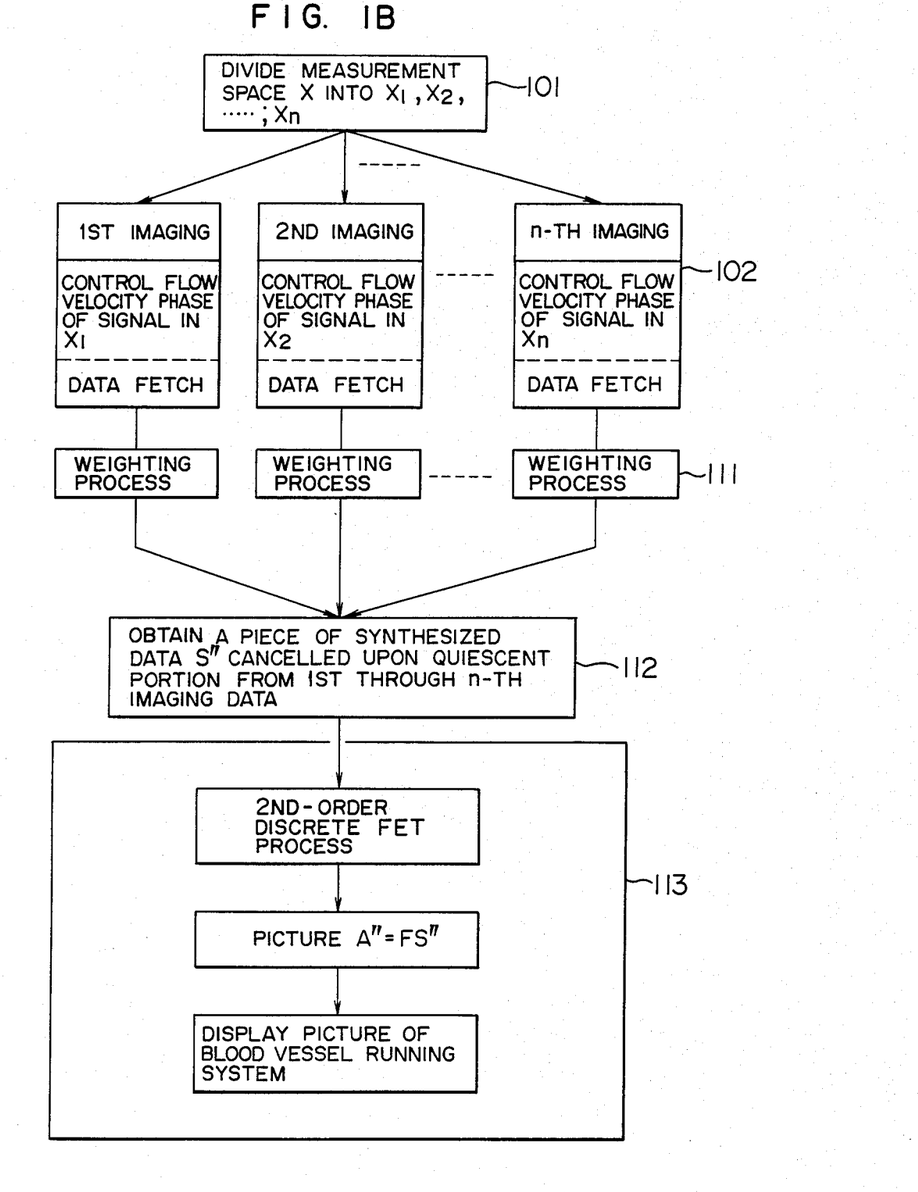

This embodiment is designed to cancel the quiescent part, only through the weighting process, in the imaging data $S_j(t,k)$ produced by gradient magnetic field $G_j$ corresponding to divided regions. FIG. 1B shows the flowchart of the operation.

(1) Steps 101 and 102 are identical to those in Embodiment 1.

(2) Step 111 implements the weighting process, provided as a function of time, for the total imaging data. This weighting process is designed such that data of the quiescent part are cancelled each other in obtaining synthesized data S'' over the total measurement space X. Accordingly, the synthesized data S'' is equivalent to the data B in Embodiment 1.

(3) Step 112 produces the above-mentioned synthesized data S''.

(4) Step 113 implements the second-order discrete FFT process for the synthesized data S'' to produce a picture A''=FS'', and displays it as a picture of the blood vessel running system.

(Embodiment 3)

This embodiment is applied to the measurement method in which the excitation of magnetization by the RF pulse is fallen by 360°, data for a quiescent part is not detected as a picture from the beginning, and only data for a blood stream part is detected.

(1) Step 101 is identical to step 101 of Embodiment 1.

(2) Step 102 is identical to step 102 of Embodiment 1, except that the magnetic resonating RF pulse 501 for falling the magnetization by 90° in item (ii) is altered to fall the magnetization by 360°. Magnetization of the quiescent part is returned the original state by the 360° fall, whereas the blood stream part does not fall by 360°, resulting in the generation of a lateral magnetization, and the phase of this lateral magnetization is going to be controlled.

(b 3) Step 103 is identical to step 103 of Embodiment 1.

(4) Step 104 implements the second-order discrete FFT for the data S(t,k), and a picture A for displaying only the blood vessel running system is produced as follows.

$$A = FS$$

(Embodiment 4)

This embodiment is applied to the case in which the angle of fall of magnetization by the RF pulse is made shallow and the time interval from one imaging to the next imaging, which is called "TR", is made shorter with the intention of high-speed imaging.

In this embodiment, signals are measured as:

$$a_j = \sqrt{T^2 - \frac{1}{2}(T_0 - t_j)^2} \quad j = 1, 2, \ldots, n$$

As in Embodiment 1. The $a_j$ draws a parabolic curve having a peak T at $t=T_0$ on the time axis, as has been explained previously. Accordingly, for one value of $a_j$, the measured signal has its phase consistent on both sides of $t=T_0$, providing data of two partial regions simultaneously.

Figure 6:
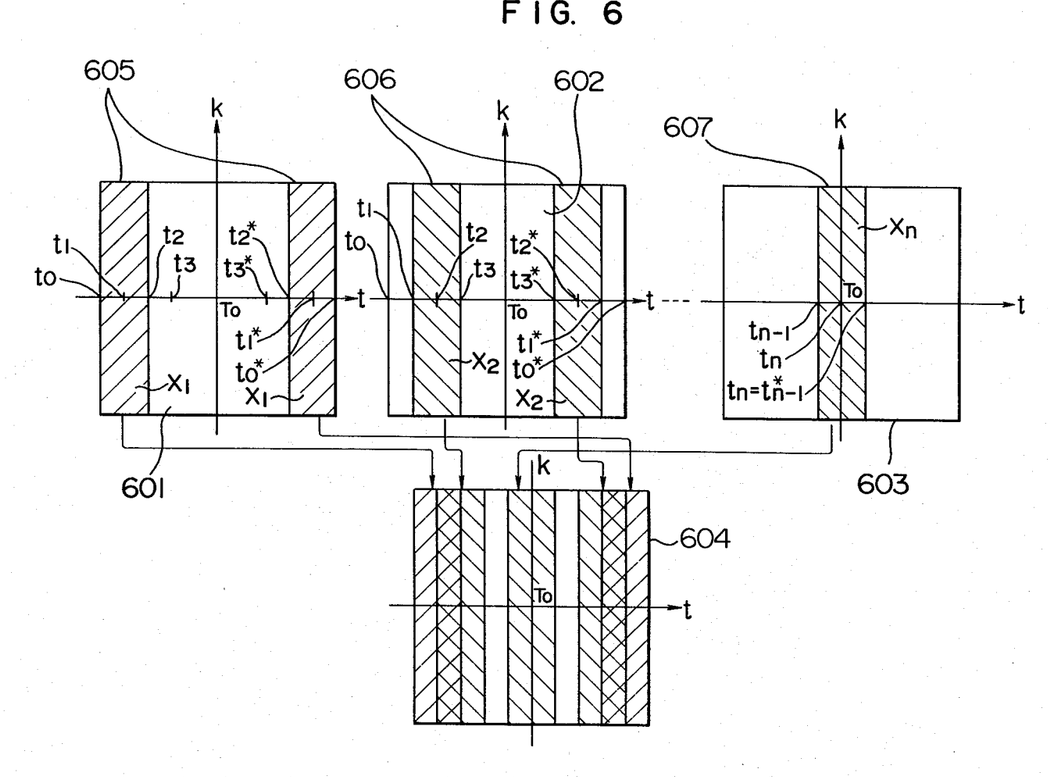
Figure 7A:
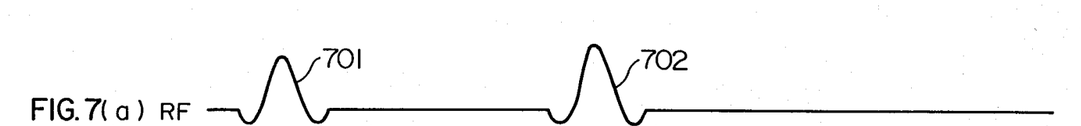
Figure 7B:
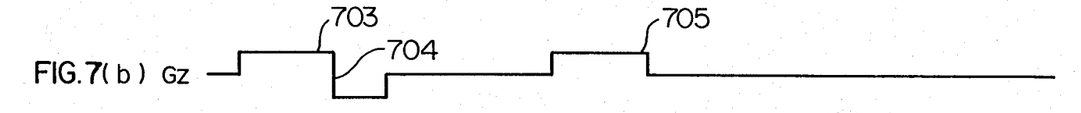
Figure 7C:
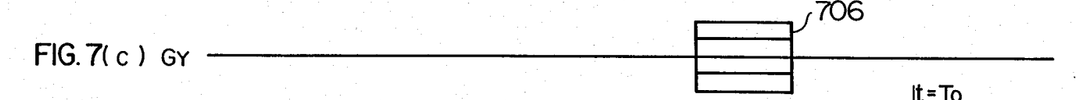
Figures 7D, 7E:
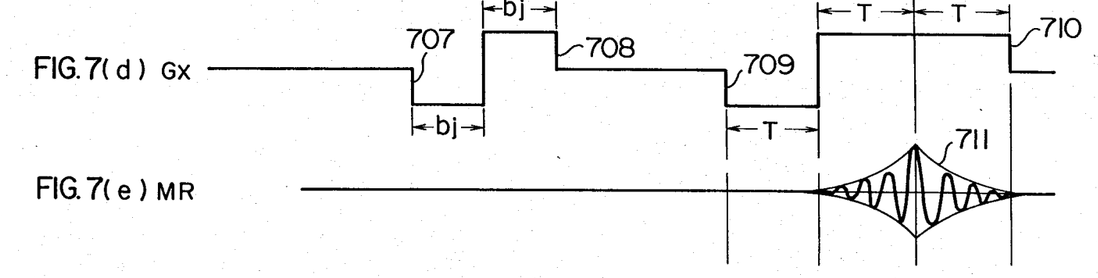

(1) Step 101 establishes partial regions $X_j$ on both sides of $t=T_0$ of the measurement space X, as shown by 605, 606 and 607 in FIG. 6. Namely, with a center time $T_0$ of echo, $X_j$ is established as shown in the following formula for points $t_j$ which equally divide by n the section of T:

$$T_0 - T \leq t \leq T_0$$

$$X_j = \{(t,k) \in X | t_{j-1} \leq t \leq t_{j+1} \text{ or } t^*_{j+1} \leq t \leq t^*_{j-1}\}$$

(where $j=1, 2, \ldots n$, $t_0 = T_0 - T$, $t_n = T_0$, $t_{n+1} = T_0 + (T/n)$, $t^*_j = 2T_0 - t_j$)

In this embodiment, measurement is carried out for the setting of $T_0 = 22$ ms, $T = 4$ ms and $\theta_j = 0$.

(2) Step 102 implements imaging by alternation of $j = 1, 2, 3, \ldots n$ for $a_j$ in items (a), (b), (c) and (d) in FIG. 5.

Here, $a_j$ is as follows.

$$a_j = \sqrt{T^2 - \frac{1}{2}C^2}$$

$$C_j = T_0 - t_j$$

At this time, the above equation (1) is met. The reason is identical to the case of step 102 in Embodiment 1.

The imaging procedures at each occasion are as follows.

(i) A body under test is placed in a static magnetic field of 5000 G.

(ii) The magnetic resonating RF pulse which falls the magnetization by 20° is applied for a duration of 4 ms, which is followed by a wait time of 26 ms. These operations are repeated 40 times.

(iii) k is incremented by 1 from −127 to 128, and the following items (a)–(c) are repeated 256 times to obtain measured signals $S_j(t,k)$.

(a) In the sequence of FIG. 5, a magnetic resonating RF pulse 501 which falls the magnetization by 20° and a z-direction gradient magnetic field Gz (0.3 G/cm) 502 are applied for a duration of 4 ms so that the magnetization of a specific slice plane is excited. Furthermore, a z-direction gradient magnetic field −Gz 503 is applied for a duration of 2 ms so that the phase of magnetization is made consistent.

(b) After that, a y-direction gradient magnetic field Gy·(k/128) (Gy=0.3 G/cm) 504 is applied for a duration of 4 ms.

(c) At the same time, an x-direction gradient magnetic field Gx (Gx=0.3 g/cm) 505 is applied for a duration of $a_j$ ms, and next an x-direction gradient magnetic field $-Gx$ 506 is applied for a duration of $T+a_j$ ms, and next an x-direction gradient magnetic field Gx 507 is applied for a duration of 2T ms and at the same time the MR signal 508 is measured. The operation is followed by a wait time of 4 ms.

(b 3) Step 103 implements such a weighting process as taking out only data in partial regions $X_1, X_2, \ldots, X_n$ from the first to n-th total imaging data $S_j(t,k)$. Weighting factors are given as a function of time.

(4) Step 104 uses the weighted measurement data $S_j(t,k)$ obtained in the previous step 103 to produce a piece of synthesized data $S(t,k)$ over the entire measurement space X, as shown by the following formula.

$$S(t,k) = \sum_{j=1}^{n-1} \{\mu(t - t_j) + \mu(t - t^*_j)\} \cdot S_j(t,k) + \mu(t - t_n) \cdot S_n(t,k)$$

where function $\mu(\tau)$ is as follows.

$$\mu(\tau) = \begin{cases} 1 - \frac{|\tau|}{D} & \text{if } |\tau| \leq D \leq \frac{T}{n} \\ 0 & \text{otherwise} \end{cases}$$

(5) Step 105 takes pictures in the usual sensitive sequence shown by (a), (b), (c) and (f) in FIG. 5 to obtain measured data $S'(t,k)$.

The procedure does not divide the measurement space, and implements items (i)–(iii) of step 102 of this embodiment.

(6) Step 106 is identical to step 106 of Embodiment 1. Data $S(t,k)$ and $S'(t,k)$ obtained in steps 104 and 105 are rendered the second-order FFT process to obtain pictures as follows.

A=FS

A'=FS'

By obtaining the difference B=A−A' of both image data, image data of the blood vessel running system is extracted.

(Embodiment 5)

This embodiment is applied to the imaging method in which the RF pulse is applied twice and the phase of magnetization is rotated by 180° by the second RF pulse so that unevennes of the static magnetic field is cancelled.

(1) Step 101 is identical to step 101 of Embodiment 4, and it sets up partial regions $X_j$ of the measurement space X on both sides of $t=T_0$. $T_0$ is 28 ms, T is 4 ms, and the target phase $\theta_j$ is defined to be $\theta_j = \gamma \cdot$(average flow velocity $\overline{v^k}$)

(2) Step 102 implements imaging by alternation of $j=1, 2, 3, \ldots, n$ for $b_j$ in items (a), (b), (c) and (d) in FIG. 7. $b_j$ is as follows.

$$b_j = \sqrt{\left(T^2 - \frac{1}{2} C_j^2 - \frac{1}{G}\right)}$$

$$C_j = T_0 - t_j$$

In this case the equation (1) is met, the reason of which will be explained in the following.

As in step 102 of Embodiment 1, the left side of the equation (1) can be written as follows.

$$G/2\{2T^2 - (T_0 - t_j)^2 - 2b_j^2\}$$

The right side of the equation (1) can be written as follows.

$$\theta_j/\gamma' = \frac{\gamma \overline{v^k}}{\gamma \overline{v^k}} = 1$$

And therefore:

$$G/2 \{2T^2 - (T_0 - t_j)^2 - 2b_j^2\} = 1$$

Solving the equation for $b_j$ gives:

$$b_j = \sqrt{T^2 - \frac{(T_0 - t_j)^2}{2} - \frac{1}{G}}$$

In this case, the gradient magnetic fields (707, 708), which has been applied before the pulse for falling the magnetization by 180° in 702 of FIG. 7, has its polarity reversed before calculating the equation (1).

The imaging procedures at each occasion are as follows. k is incremented by 1 from −127 to 128 so that the following items (i)–(vi) are repeated 256 times to obtain measured signals $S_j(t,k)$. The body under test is placed in a static magnetic field of 5000 G.

(i) The ECG operates to wait for a specific time length from the R-wave of heart beat.

(ii) After that, a magnetic resonating RF pulse 701 which falls the magnetization by 90° and a z-direction gradient magnetic field Gz (0.3 G/cm) 703 are applied for a duration of 4 ms so that the magnetization of a specific slice plane is excited, and furthermore a z-direction gradient magnetic field −Gz 704 is applied for a duration of 2 ms so that the phase of magnetization is made consistent.

(iii) After that, an x-direction gradient magnetic field −G (0.3 G/cm) 707 is applied for a duration of $b_j$ ms, and next an x-direction gradient magnetic field Gx 708 is applied for a duration of $b_j$ ms.

(iv) After that, a magnetic resonating RF pulse 702 which falls the magnetization by 180° and a z-direction gradient magnetic field Gz (0.3 G/cm) 705 are applied for a duration of 4 ms so that the magnetization of the slice plane is reversed.

(v) After that, a y-direction gradient magnetic field Gy·k/128 (Gy=0.3 G/cm) 706 is applied for a duration of 4 ms.

(vi) At the same time, an x-direction gradient magnetic field −Gx 709 is applied for a duration of T ms, and next an X-direction gradient magnetic field Gx 710 is applied for a duration of 2T ms and simultaneously the MR signal 711 is measured.

(b 3) Step 103 is identical to step 103 of Embodiment 4, and it implemets such a weighting process as for taking out only data of partial regions $X_1, X_2, \ldots, X_n$ for the whole first through n-th imaging data $S_j(t,k)$. Weighting factors are given as a function of time.

(4) Step 104 is identical to step 104 of Embodiment 4, and it produces synthesized data $S(t,k)$ over the entire measurement space X.

(5) Step 105 implements imaging in the sequence of (a), (b), (c) and (f) of FIG. 7 to obtain measured data $S'(t,k)$. This operation is equivalent to the usual sensitive sequence, and it is an imaging method without the detection of signal from a blood stream part. The procedures are identical to the case of step 102 in this embodiment, except that Gx of (f) in FIG. 7 is used as Gy.

(6) Step 106 is identical to step 106 of Embodiment 6, and it takes differences among image data obtained to extract only image data of the blood vessel running system.

Moreover, in this embodiment, the phase of signals on the picture of blood vessel running system is proportional to the average blood flow velocity $\bar{v}^k$. Accordingly, by calculating $\theta_j/\gamma$, the average flow velocity $\bar{v}^k$ can be evaluated.

I claim:

1. A method of nuclear magnetic resonance imaging comprising the steps of:
   (a) setting, to a predetermined target phase value, the difference between the phase of a resonance signal originating from a part of a body under test which part has a flow velocity and the phase of a resonance signal which would originate from said same part on assumption that said same part is quiescent;
   (b) dividing a measurement space, that is a time band in which said resonance signal is generated, into a plurality of partial regions;
   (c) setting a particular measurement time point in each of said divided partial region;
   (d) obtaining such a gradient magnetic field that said phase difference is equal to said predetermined value at said particular measurement time point;
   (e) successively measuring said resonance signal over the entirety of said measurement space under the application of said gradient magnetic field;
   (f) measuring said resonance signal, by following said steps (c), (d) and (e), for all of said partial regions; and
   (g) extracting data of said part having flow velocity from said measured resonance signal.

2. An imaging method according to claim 1, wherein said gradient magnetic field is obtained as $G_j(t)$ in the following formula:

$$\int_0^{t_j} G_j(t) t \, dt - t_j \int_{T_0}^{t_j} G_j(t) dt = \frac{\theta_j}{\gamma'}$$

where $t_j$ is said measurement time point, $T_0$ is a center time of echo of phase value, $\gamma'$ is a constant, and subscript $\theta_j$ indicates said partial region.

3. An imaging method according to claim 2, wherein said extraction step comprises the steps of:
   (a) extracting said resonance signal measured over a narrow time band including said particular measurement time point from said resonance signal measured over the entirety of said measurement space;
   (b) synthesizing image data for the entirety of said measurement space only based on said extracted resonance signal which is the signal at the time when said phase difference is equal to said predetermined value; and
   (c) extracting the data of said part having flow velocity by cancelling data related to the quiescent part in said synthesized data.

4. An imaging method according to claim 3, wherein said step of extracting said resonance signal measured over a narrow time band including said particular measurement time point comprises a step of extraction which multiplies weighting factors as a function of time to said signal obtained by a single measurement over the entirety of said measurement space under the application of said gradient magnetic field $G_j$.

5. An imaging method according to claim 4, wherein said step of extracting said part having flow velocity comprises a step of cancelling the signal of said quiescent part by comparison with the data produced by sensitive sequence in which a signal from said part having flow velocity is small and a signal from said quiescent part is large.

6. An imaging method according to claim 1, wherein said division step divides said measurement space such that a plurality of said partial regions are comprised in the range of single measurement.

7. An imaging method according to claim 5, wherein said division step divides said measurement space such that a plurality of said partial regions are comprised in the range of single measurement.

8. An imaging method according to claim 1, wherein said extraction step comprises a step of multiplying weighting factors to said resonance signals measured over the entirety of said measurement space so that said resonance signal from said quiescent part is cancelled out.

9. An apparatus for nuclear magnetic resonance imaging comprising:
   (a) means of setting, to a predetermined target phase value, the difference between the phase of a resonance signal originating from a part of body under test which part has a flow velocity and the phase of a resonance signal which would originate from said same part on assumption that said same part is quiescent;
   (b) means of dividing a measurement space, that is a time band in which said resonance signal is generated, into a plurality of partial regions;
   (c) means of setting a particular measurement time point in each of said divided partial region;
   (d) means of obtaining such a gradient magnetic field that said phase difference is equal to said predetermined value at said particular measurement time point;
   (e) means of successively measuring said resonance signal over the entirety of said measurement space under the application of said gradient magnetic field;
   (f) means of measuring said resonance signal, by following said steps (c), (d) and (e), for all of said partial regions; and
   (g) means of extracting data of said part having flow velocity from said measured resonance signal.

10. An imaging apparatus according to claim 9, wherein said means of obtaining said gradient magnetic field functions by solving the following equation for $G_j(t)$.

$$\int_0^{t_j} G_j(t)t\,dt - t_j \int_{T_0}^{t_j} G_j(t)\,dt = \frac{\theta_j}{\gamma'}$$

where $t_j$ is said measurement time point, $T_0$ is a center time of echo of said resonance signal, $\theta_j$ is said target phase value, $\gamma'$ is a constant, and subscript j indicates said partial region.

11. An imaging apparatus according to claim 10, wherein said means of extracting said part having flow velocity comprises:
   (a) means of extracting a resonance signal measured over a narrow time band including said particular measurement time point from said resonance signal measured over the entirety of said measurement space;
   (b) means of synthesizing image data for the entirety of said measurement space only based on said extracted resonance signal which is the signal at the time when said phase difference is equal to said predetermined value; and
   (c) means of extracting data of said flow velocity by cancelling data related to the quiescent part in said synthesized data.

12. An imaging apparatus according to claim 11, wherein said means of extracting said resonance signal measured over a narrow time band including said particular measurement time point comprises means of extraction which multiplies weighting factors as a function of time to said signal obtained by a single measurement over the entirety of said measurement space under the application of said gradient magnetic field $G_j$.

13. An imaging apparatus according to claim 12, wherein said means of extracting said part having flow velocity comprises means of cancelling the signal of said quiescent part by comparison with the data produced by sensitive sequence in which a signal from said part having flow velocity is small and a signal from said quiescent part is large.

14. An imaging apparatus according to claim 9, wherein said division means comprises means which divides said measurement space such that a plurality of said partial regions are comprised in the range of single measurement.

15. An imaging apparatus according to claim 13, wherein said division means comprises means which divides said measurement space such that a plurality of said partial regions are comprised in the range of single measurement.

16. An imaging apparatus according to claim 9, wherein said extraction means comprises means of multiplying weighting factors to said resonance signals measured over the entirety of said measurement space so that the resonance signal from said quiescent part is cancelled out.

* * * * *